United States Patent [19]
Tseng

[11] Patent Number: 5,821,139
[45] Date of Patent: Oct. 13, 1998

[54] METHOD FOR MANUFACTURING A DRAM WITH INCREASED ELECTRODE SURFACE AREA

[75] Inventor: Horng-Huei Tseng, Hsinchu, Taiwan

[73] Assignee: Vanguard International Semiconductor Corporation, Hsinchu, Taiwan

[21] Appl. No.: 726,647

[22] Filed: Oct. 7, 1996

[51] Int. Cl.⁶ .................... H01L 21/8242; H01L 21/20
[52] U.S. Cl. ................. 438/239; 438/240; 438/253; 438/397
[58] Field of Search ............................ 438/238, 239, 438/240, 253, 254, 381, 396, 397; 257/296, 306, 309, 310

[56] References Cited

U.S. PATENT DOCUMENTS

| | | | |
|---|---|---|---|
| 5,340,763 | 8/1994 | Dennison | 438/398 |
| 5,405,796 | 4/1995 | Jones, Jr. | 438/253 |
| 5,552,334 | 9/1996 | Tseng | 438/397 |

*Primary Examiner*—Joni Chang
*Attorney, Agent, or Firm*—Christensen, O'Connor Johnson & Kindness

[57] ABSTRACT

A method of forming a capacitor on a semiconductor substrate includes forming a first silicon oxide layer on the semiconductor substrate. A first photoresist is patterned on the first silicon oxide layer. An etching step is used to etch the first dielectric layer to form a hole in the first silicon oxide layer that is aligned with a source/drain region in the substrate. Then the first photoresist is removed. A second photoresist is patterned on the first silicon oxide layer. The opening of the photoresist is wider than the opening of the hole. The first silicon oxide layer is etched using the second photoresist as an etching mask to form a contact hole. A first polysilicon layer is formed on the first silicon oxide layer and in the contact hole. Then a second silicon oxide layer is deposited on the first polysilicon layer. An anisotropic etching is performed to etch the second silicon oxide layer. Then a second polysilicon layer is formed on the first silicon oxide layer, the first polysilicon layer, the second silicon oxide layer. Then a patterning and an etching processes are used to etch the second polysilicon layer. The first oxide layer and the second oxide layer is removed by using a highly selective etching to form a bottom storage node of the capacitor.

28 Claims, 5 Drawing Sheets

METHOD FOR MANUFACTURING A DRAM WITH INCREASED ELECTRODE SURFACE AREA

FIELD OF THE INVENTION

The present invention relates to methods of fabricating a semiconductor device, and more specifically, to methods of forming a Dynamic Random Access Memory (DRAM) cell. Still more particularly, the present invention relates to methods of forming a DRAM cell capacitor to reduce cell area and achieve high capacitance.

BACKGROUND

Semiconductor DRAM devices have many memory cells. Indeed, a memory cell is provided for each bit stored by a DRAM device. Each memory cell typically consists of a storage capacitor and an access transistor. Either the source or drain of the access transistor is connected to one terminal of the capacitor. The other side of the transistor's channel and the transistor gate electrode are connected to external connection lines called a bit line and a word line, respectively. The other terminal of the capacitor is connected to a reference voltage. The formation of a DRAM memory cell includes the formation of a transistor, a capacitor and contacts to external circuits. The capacitor type that has been typically used in DRAM memory cells are planar capacitors, because they are relatively simple to manufacture.

The reduction in memory cell area is required for high density ultra large scale integration (ULSI) DRAM devices. This causes reduction in capacitor area, resulting in the reduction of cell capacitance. Indeed, in order to achieve high performance (e.g., high density) DRAM devices, the memory cells must be scaled down in size to the submicrometer range. It has been the trend in integrated circuit technology to increase the density of semiconductor devices per unit area of silicon wafer. However, this reduction in size can cause performance problems, especially for DRAM memory cells that use planar capacitors. In this case, because the area of the charge storage capacitor is also decreased, the capacitance becomes relatively small. This decrease in storage capacitance leads to lowered signal-to-noise ratios and increased errors due to alpha particle interference.

Accordingly, for very small memory cells, planar capacitors become very difficult to use reliably. Additionally, as the capacitance decreases, the charge held by storage capacitor must be refreshed often. A simple stacked planar capacitor generally cannot provide sufficient capacitance for good performance, even with high performance dielectrics, such as $Ta_2O_5$.

Prior art approaches to overcoming these problems have resulted in the development of the trench capacitor (see for example U.S. Pat. No. 5,374,580) and the stacked capacitor (see for example U.S. Pat. No. 5,021,357). The trench capacitor has the well known problem of "gated diode leakage". Reducing the thickness of the dielectric also can improve the capacitance of the capacitor, but this approach is limited because of yield and reliability problems.

In another method, a capacitor over bit line (COB) cell with a hemispherical-grain (HSG-Si) polysilicon storage node has been developed (see "A CAPACITOR OVER BIT LINE CELL WITH HEMISPHERICAL-GRAIN STORAGE NODE FOR 64 Mb DRAMs", M. Sakao et al., Microelectronics Research Laboratories, NEC Corporation). The feature of the prior art is that a capacitor is formed by HSG-Si using "seeding method" to increase the area of the capacitor. Yet another prior capacitor cell has been disclosed in U.S. Pat. No. 5,302,540. This patent discloses a capacitor having a first conductive layer with a plurality of cylindrical sections, a dielectric layer over the first conductive layer, and a second conductive layer formed over the dielectric layer.

SUMMARY

In accordance with the present invention, a method for manufacturing a DRAM with reduced cell area is provided. In one embodiment, a semiconductor substrate having a transistor and a word line formed therein and thereon is provided. For isolation, a first oxide layer is deposited on the substrate and on the transistor and word line structure. A standard patterning and etching process is used to create a contact window in the first dielectric layer. Then a metal layer is formed on first dielectric layer. A patterning and an etching process is used to etch the metal layer to form a bit line. Then a nitride layer is deposited on the first dielectric layer for isolation purposes and to serve as an etching stopper or etchstop.

A second dielectric layer is subsequently formed on the nitride layer. A first photoresist is patterned on the second dielectric layer, then a reactive ion etching (RIE) process is used to create a narrow trench that is aligned with a source/drain region of the transistor.

Next, the opening of the first photoresist is expanded using photolithography and etching process. The opening of the first photoresist is now wider than the opening of the narrow trench centered over the opening of the narrow trench. The second dielectric layer is subsequently anisotropically etched, not only forming a wide trench centered on the narrow trench, but also extending the narrow trench to expose the source/drain region to form a contact hole. Then the first photoresist is stripped. A second polysilicon layer is formed over and in the contact hole and on the second dielectric layer and conformally lining the sidewalls of the wide trench. Next, a third dielectric layer is conformally deposited on the second polysilicon layer and along the sidewalls of the wide trench.

An etching process is used to etch the third dielectric layer to the surface of the second polysilicon layer. A third photoresist is patterned on the third dielectric layer. A RIE process is performed to etch a portion of the third dielectric layer by using the photoresist as an etching mask. A third polysilicon layer is formed on the second dielectric layer, the second polysilicon layer and along the surface of the third dielectric layer. An anisotropic dry etching process is used to etch the third polysilicon layer, thereby forming the bottom electrode of the capacitor.

Next, an etching process having a high etching selectivity between oxide and polysilicon (e.g., a relative susceptibility of about 100 to 1) is used to remove the second dielectric layer and the third dielectric layer. A dielectric film is deposited along the surface of the third polysilicon layers and the second polysilicon. Finally, a fourth polysilicon layer is deposited over the dielectric film to complete the fabrication of the DRAM cell capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

In the present invention, a new method is disclosed to fabricate a DRAM cell. The formation of the DRAM cell includes many process steps that are well known in the art. For example, the process of photolithography masking and etching is used extensively herein. One standard photolithography process includes creating a photolithography mask containing the pattern of the component to be formed, coating the wafer with a light sensitive material known as a photoresist, exposing the photoresist coated wafer to ultraviolet light through the mask to soften or harden parts of the photoresist (depending on whether positive or negative photoresist is used), removing the softened parts of the photoresist, etching to remove the materials left unprotected by the photoresist and stripping the remaining photoresist. This photolithography masking and etching process is referred to herein as "patterning and etching." This and other standard processes are used extensively herein without a detailed discussion of well known technologies.

Figure 1:
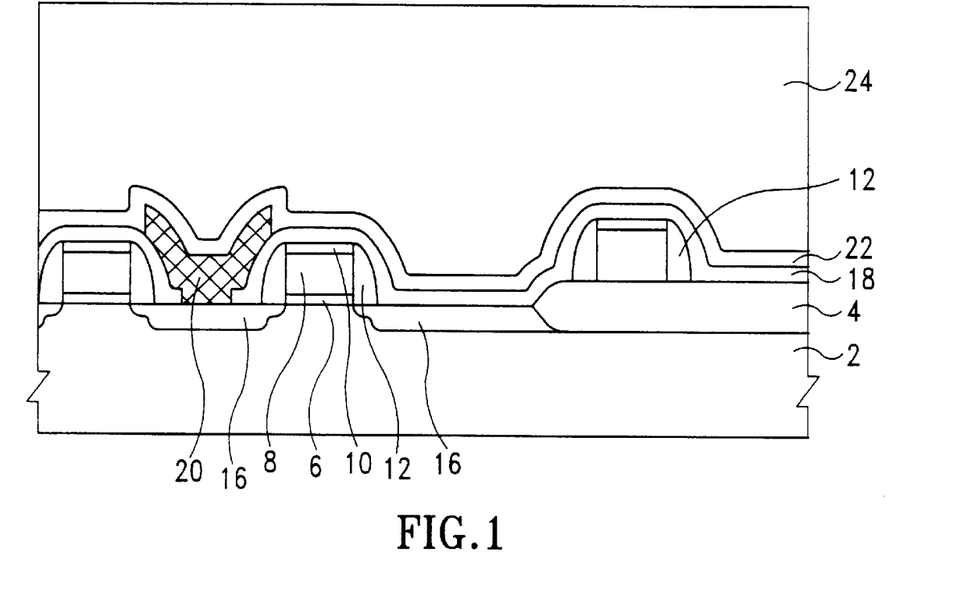
FIG. 1 is a cross-sectional view of a semiconductor wafer illustrating the steps of forming a gate structure, a first layer, a nitride layer, a second dielectric layer on a substrate, according to one embodiment of the present invention.

Referring to FIG. 1, a single crystal silicon substrate 2 with a <100> crystallographic orientation, is provided. Transistors, word lines and bit lines are formed in and on the substrate 2 in any suitable manner. In one embodiment, the transistor, word lines and bit lines are formed as follows.

A thick field oxide (FOX) region 4 is formed to provide isolation between devices on the substrate 2. The FOX region 4 is created in a conventional manner. For example, the FOX region 4 can be formed via photolithography and dry etching steps to etch a silicon nitride-silicon dioxide composition layer. After the photoresist is removed and wet cleaned, thermal oxidation in an oxygen-steam environment is used to grow the FOX region 4 to a thickness of about 4000–6000 angstroms.

Next, a silicon dioxide layer 6 is created on the top surface of the substrate 2 to serve as the gate oxide for subsequently formed Metal Oxide Silicon Field Effect Transistors (MOSFETs). In this embodiment, the silicon dioxide layer 6 is formed by using an oxygen-steam ambient, at a temperature of about 850°–1000° C. Alternatively, the oxide layer 6 may be formed using any suitable oxide chemical compositions and procedures. In this embodiment, the thickness of the silicon dioxide layer 6 is approximately 100 angstroms.

A doped first polysilicon layer 8 is then formed over the FOX region 4 and the silicon dioxide layer 6 using a Low Pressure Chemical Vapor Deposition (LPCVD) process. In this embodiment, the first polysilicon layer 8 has a thickness of about 2000–3500 angstroms and is doped with $P^{31}$ dopants with a concentration of about 1E20 atoms/cm$^3$. A capped oxide layer 10 is formed on the first polysilicon layer 8 to a thickness about 500–1200 angstroms. Next, standard photolithography and etching steps are used to form a gate structure and a word line 14. Sidewall spacers 12 are subsequently formed on the sidewalls of the first polysilicon layer. Thereafter, active regions 16 (i.e. the source and the drain) are formed by using well known processes to implant appropriate impurities in those regions.

A first dielectric layer 18 is deposited on the gate structure and the substrate 2 for isolation. The first dielectric layer 18 in the preferred embodiment is composed of silicon oxide. A patterning and etching process is used to create a contact window in the first dielectric layer 18. Then a metal layer is formed on first dielectric layer 18 and in the contact window. A patterning and etching process is used to etch the metal layer to form a bit line 20. Then a nitride layer 22 is deposited on the first dielectric layer 18 and bit line 20 to a thickness about 1500 angstroms. The nitride layer 22 is formed using a LPCVD process, and serves as isolation layer and an etching stopper (as described below in conjunction with FIG. 10). A second dielectric layer 24 is subsequently formed on the nitride layer 22. The second dielectric layer 24 can be formed by using any suitable material such as, for example, silicon oxide. The thickness of the second dielectric layer 24 is about 4000–10000 angstroms.

Figure 2:
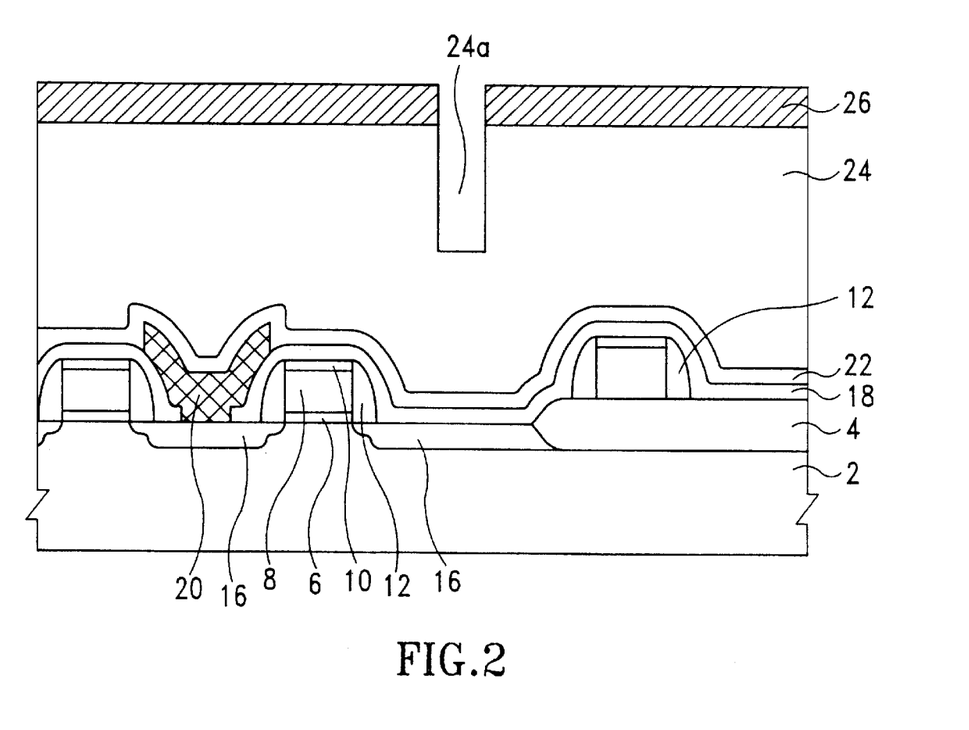
FIG. 2 is a cross-sectional view of a semiconductor wafer illustrating the steps of forming a hole in the second dielectric layer, according to one embodiment of the present invention.

As shown in FIG. 2, a first photoresist 26 is patterned on the second dielectric layer 24, and then a RIE process is used to create a hole 24a by removing a portion of the second dielectric layer 24 left uncovered by the first photoresist 26. The etchant used in this RIE process is $CHF_3+Ar+O_2$ plasma. The hole 24a is aligned with the active region 16 of the MOSFET that is not connected to the bit line 20, and has a width of about 3500 angstroms. The first photoresist 26 is then etched to expand the opening of the photoresist 26.

Figure 3:
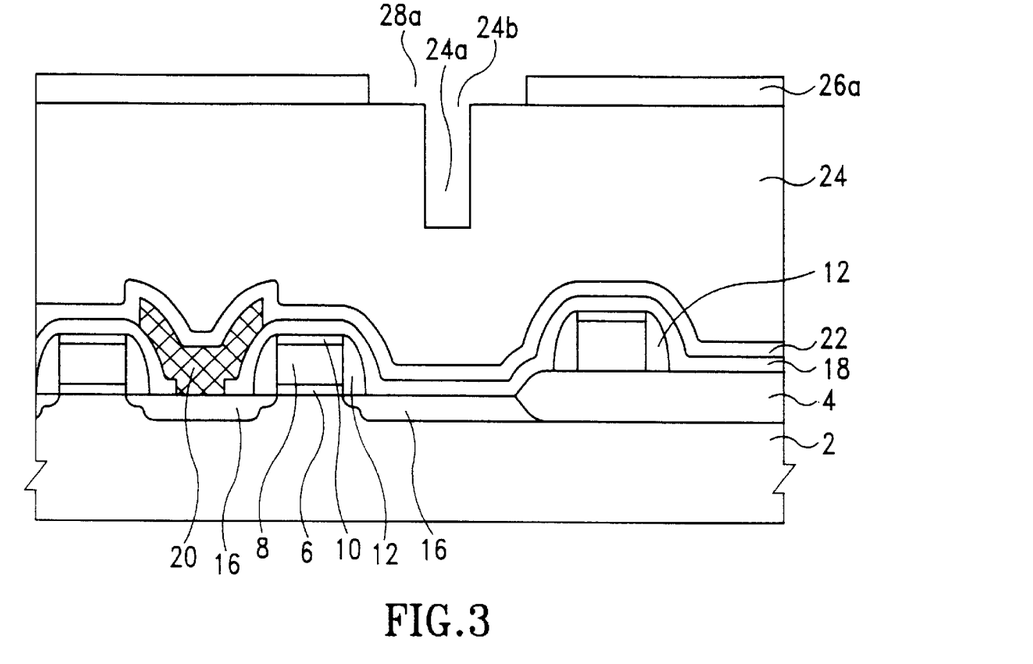
FIG. 3 is a cross-sectional view of a semiconductor wafer illustrating the steps of forming a second photoresist on the substrate, according to one embodiment of the present invention.
Figure 4:
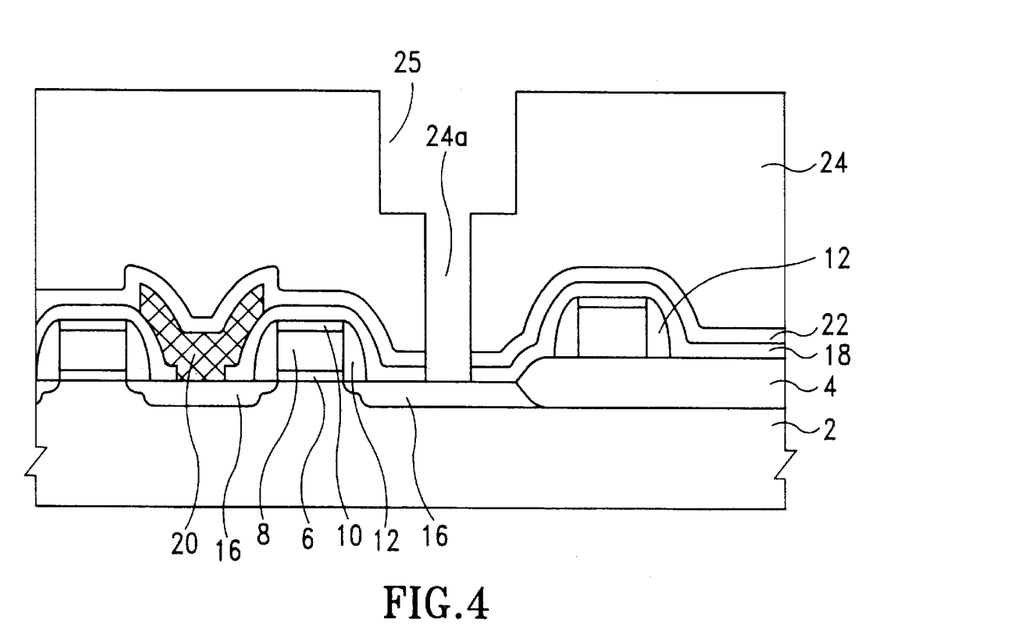
FIG. 4 is a cross-sectional view of a semiconductor wafer illustrating the step of etching the second dielectric layer to form a contact hole, according to one embodiment of the present invention.

Turning to FIG. 3, a portion of the first photoresist 26a is then etched to expand the opening 28a of the photoresist 26a using photolithography and etching steps. In the preferred embodiment, the opening 28a of the first photoresist 26a is wider than the opening 24b of the hole 24a. Further, the opening 28a is preferably centered exactly over the opening 24b. Referring to FIG. 4, a RIE is subsequently performed to further etch the second dielectric layer 24. In this procedure, the hole 24a is further etched to expose the source/drain region 16 in the substrate 2, forming a contact hole. The etchant used in this RIE process is $CHF_3+AR+O_3$ plasma. In addition, this etching step also forms a wider portion 25 in the upper portion of the hole 24a. Then the first photoresist 26a is stripped.

Figure 5:
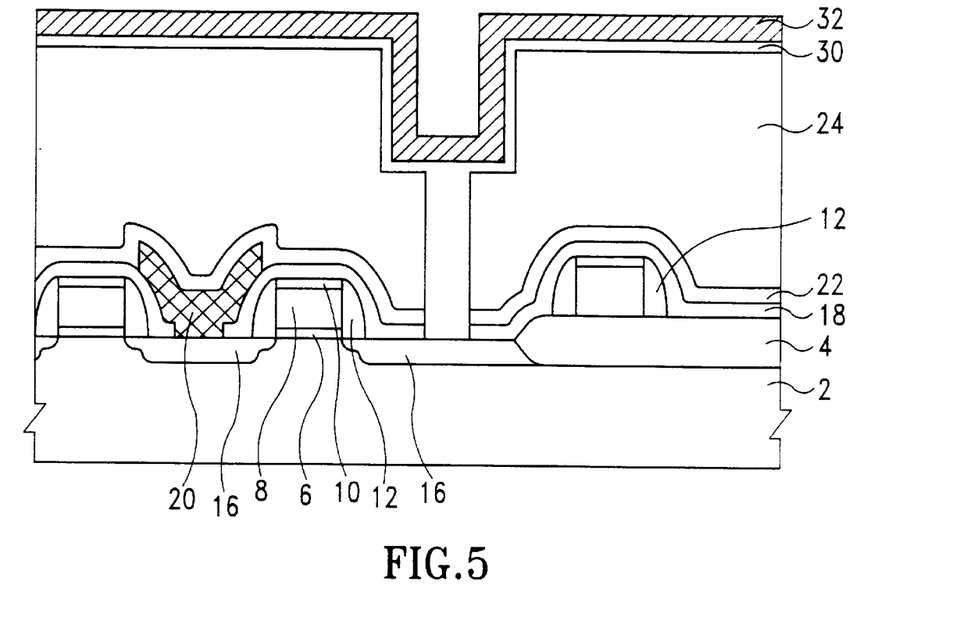
FIG. 5 is a cross-sectional view of a semiconductor wafer illustrating the steps of forming a second polysilicon layer and third dielectric layer, according to one embodiment of the present invention.

Referring to FIG. 5, a second polysilicon layer 30 is formed over and in the contact hole 24a and on the second dielectric layer 24. The second polysilicon layer 30 fills the lower portion of the hole 24a, while lining the sidewalls of the wider portion 25. The second polysilicon layer 30 is preferably formed using conventional low pressure chemical vapor deposition (LPCVD) process. The thickness of the second polysilicon layer 30 is optimally about 1200 angstroms above the top surface of the second dielectric layer 24, any thickness in the range of 500–2000 can be used. The second polysilicon layer 30 is preferably chosen from doped polysilicon or in-situ doped polysilicon. In this embodiment, the dopant is $p^{31}$ with a concentration of about 1E20. Next, a third dielectric layer 32 is deposited on the second polysilicon layer 30 and along the sidewalls of the contact hole 24a. In this embodiment, the third dielectric layer 32 is formed of silicon oxide and has a thickness of about 1000 angstroms, although any suitable thickness in the range of 500–2000 angstroms can be used.

Figure 6:
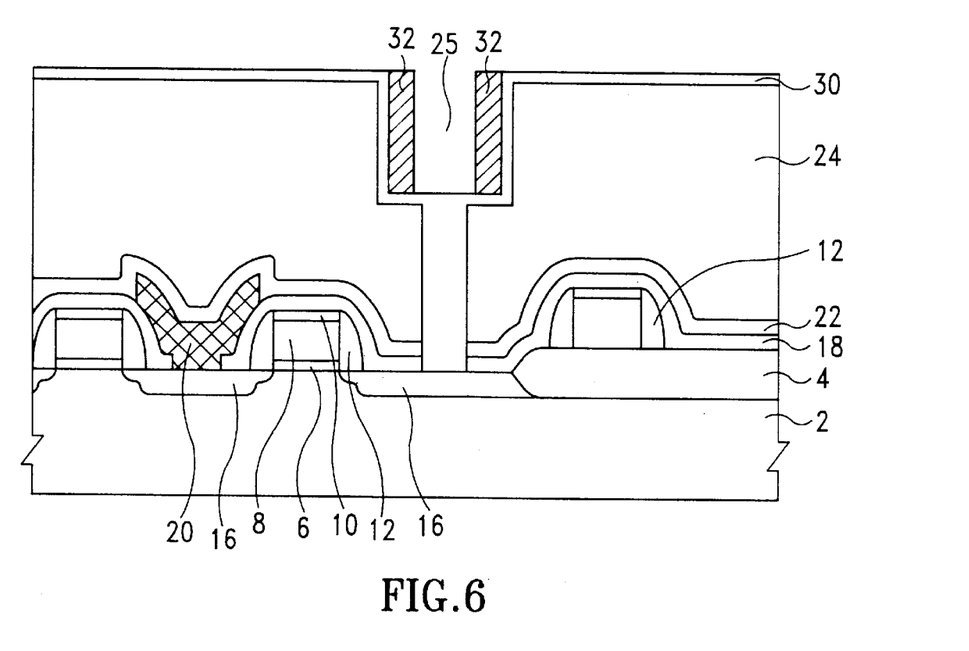
FIG. 6 is a cross-sectional view of a semiconductor wafer illustrating the step of etching the third dielectric layer, according to one embodiment of the present invention.

As shown in FIG. 6, the third dielectric layer 32 is then etched back. An anisotropic RIE etching process is used to etch the third dielectric layer 32 to the surface of the second conductive layer 30. As a result of this etching, the residual portions of the dielectric layer 32 form a sidewall spacer in the wide portion 25 of the contact hole.

Figure 7:
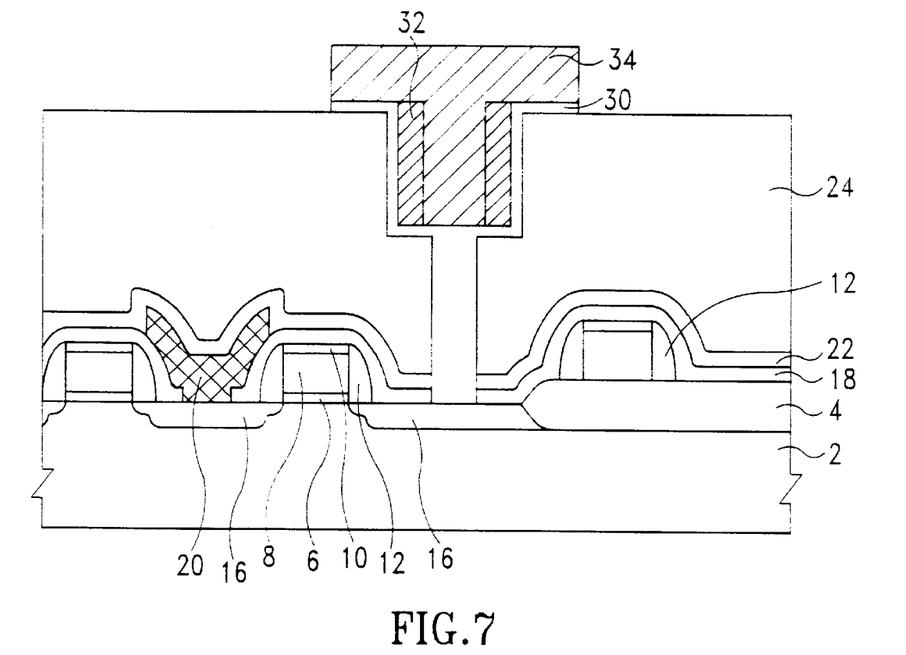
FIG. 7 is a cross-sectional view of a semiconductor wafer illustrating the step of etching the second polysilicon layer, according to one embodiment of the present invention.

As seen in FIG. 7, a second photoresist 34 is patterned on the second conductive layer 30 to form an etching mask over and in the wider portion 25 of the contact hole. In this embodiment, the photoresist mask 34 is slightly larger than the wider portion 25. A RIE process is performed to etch a portion of the second polysilicon layer 30 by using the photoresist 34 as an etching mask. Then the second photoresist 34 is stripped.

Figure 8:
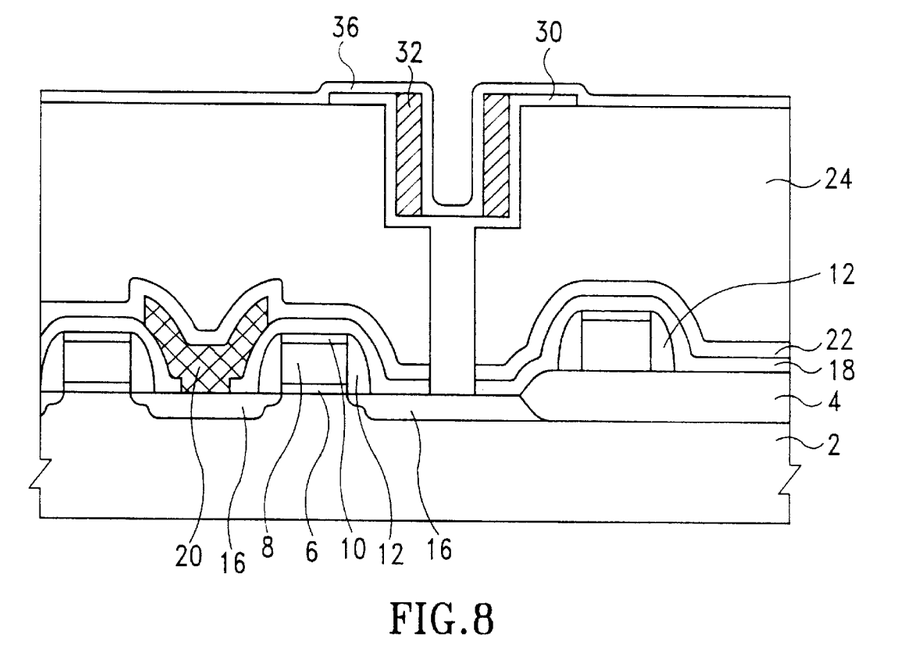
FIG. 8 is a cross-sectional view of a semiconductor wafer illustrating the step forming a third polysilicon layer, according to one embodiment of the present invention.

Turning to FIG. 8, a third polysilicon layer 36 is conformally formed on the second dielectric layer 24, the second polysilicon layer 30 and along the top surface of the third dielectric layer 32. The third polysilicon layer 36 is also formed by LPCVD with a thickness about 500–2000 angstroms. Preferably, the third polysilicon layer 36 is doped in the same manner as the second polysilicon layer 30.

Figure 9:
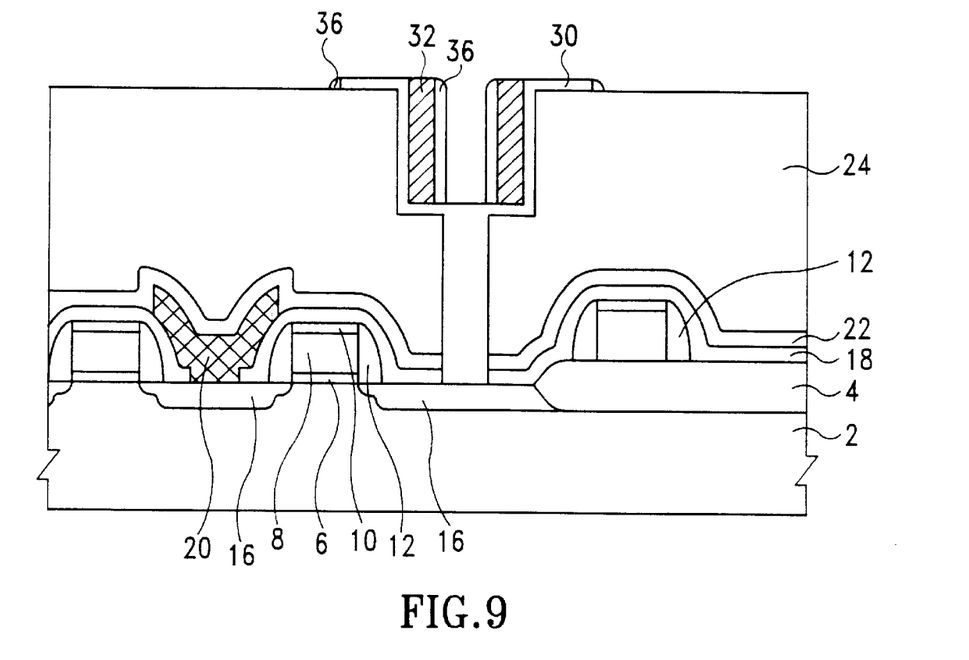
FIG. 9 is a cross-sectional view of a semiconductor wafer illustrating the step of etching the third polysilicon layer, according to one embodiment of the present invention.

Referring to FIG. 9, an anisotropic dry etching process is then used to etch the third polysilicon layer 36. Residual portions of the third polysilicon layer 36 are left on the sidewalls of the third dielectric layer 32 and attached to the ends of the second polysilicon layer 30 after the etching.

Figure 10:
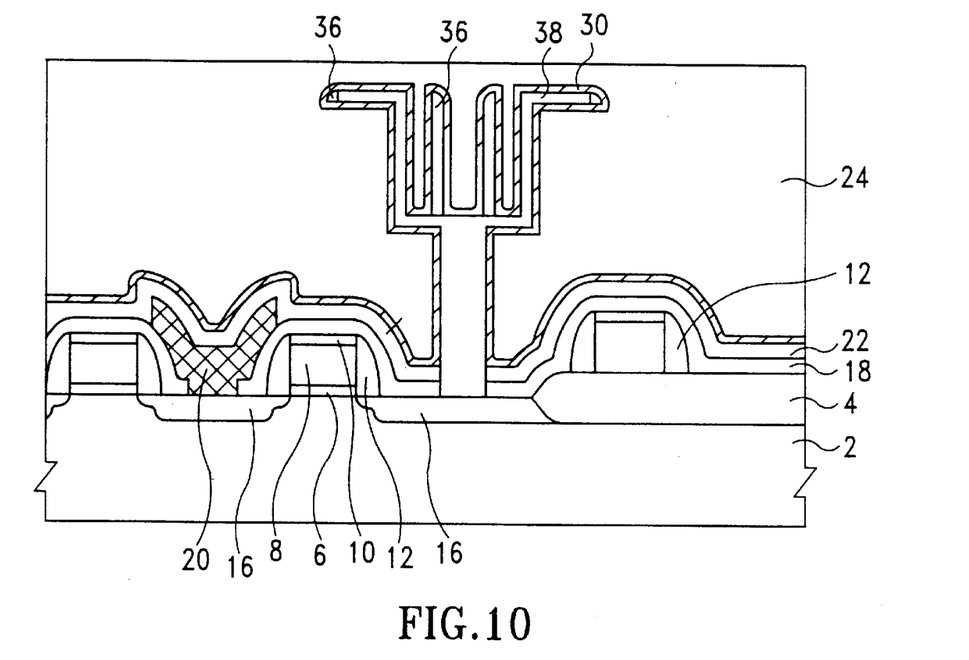
FIG. 10 is a cross-sectional view of a semiconductor wafer illustrating the steps of removing the second dielectric layer, the third dielectric layer and forming a dielectric film, a fourth polysilicon layer, according to one embodiment of the present invention.

Next, as shown in FIG. 10, an etching process having a high etching selectivity between oxide and polysilicon (i.e., with a relative susceptibility of about 100 to 1) is used to remove the second dielectric layer 24 and the third dielectric layer 32. In this embodiment, a HF vapor is used to remove the silicon oxide. The nitride layer 22 serves as an etching stopper to prevent etching of the first dielectric layer 18. After this etching process, the resulting polysilicon structure serves as a bottom storage node for the DRAM cell capacitor.

A dielectric film 38 is then deposited along the surface of the bottom storage node formed by the second and third polysilicon layers 20 and 36. The dielectric film 38 is preferably formed of either a double film of nitride/oxide film, a triple film of oxide/nitride/oxide, or any other high dielectric film such as tantalum oxide($Ta_2O_5$). Finally, a fourth polysilicon layer 40 is deposited using a conventional LPCVD process over the dielectric film 36. The fourth polysilicon layer 40 provides a top storage electrode and is formed of doped polysilicon or in-situ doped polysilicon. In this embodiment, the thickness of the fourth polysilicon layer is about 2000 angstroms. Thus, the resulting structure forms a semiconductor capacitor that provides an enlarged electrode surface area. This increased electrode surface area of the capacitor increases the capacitance of the capacitor. Therefore the present invention increases the performance of the capacitor, thereby allowing a smaller sized capacitor to be used in the DRAM cell. Thus, the density of the DRAM can be increased without loss of capacitor performance relative to convention DRAM cells using planar capacitors.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a capacitor on a semiconductor substrate, said method comprising:

forming a first dielectric layer above said semiconductor substrate;

forming and patterning a first photoresist having an opening on said first dielectric layer;

etching a portion of said first dielectric to form a hole in said first dielectric layer using said first photoresist as an etching mask, said hole having an opening of a first width;

expanding the opening of said first photoresist, the expanded opening of said first photoresist is approximately centered over said hole and the expanded opening of said first photoresist having a second width, said second width of the expanded opening of said first photoresist is greater than said first width of the opening of said hole;

etching said first dielectric layer and said hole using said first photoresist with the expanded opening as an etching mask to form a contact hole to said substrate;

stripping said first photoresist;

forming a first conductive layer on said first dielectric layer and in said contact hole;

forming a second dielectric layer along a surface of said first conductive layer;

anisotropically etching said second dielectric layer to the surface of said first conductive layer, wherein residual portions of said second dielectric layer are left on sidewalls of said first conductive layer;

forming and patterning a second photoresist on said first conductive layer wherein said second photoresist covers said contact hole;

etching said first conductive layer using said second photoresist as an etching mask;

stripping said second photoresist;

forming a second conductive layer on said first dielectric layer, said first conductive layer and over a top surface of said second dielectric layer;

anisotropically etching said second conductive layer, wherein portions of said second conductive layer are left on sidewalls of said residual portions of said second dielectric layer and said first conductive layer;

removing said first dielectric layer and said second dielectric layer; said first and second conductive layers serve as a bottom storage node of said capacitor;

forming a dielectric film on said bottom storage node; and forming a third conductive layer over said dielectric film to serve as a top storage node of said capacitor.

2. The method of claim 1, wherein before forming said first dielectric layer, said method further comprises:

forming a field oxide (FOX) region to provide isolation between devices on said substrate;

forming a silicon dioxide layer on a top surface of said substrate to serve as a gate oxide;

forming a fourth polysilicon layer over said FOX region and said silicon dioxide layer;

patterning and etching said fourth polysilicon layer to form a gate structure and a word line;

forming a source region and a drain region in said substrate by ion implantation;

forming a third dielectric layer on said gate structure and said substrate;

forming a contact window in said third dielectric layer by using a patterning and etching process;

forming a metal layer on said third dielectric layer and said contact window;

patterning and etching said metal layer to form a bit line; and forming a nitride layer on said third dielectric layer and said bit line to serve as an etching stopper.

3. The method of claim 1, wherein said first dielectric layer comprises silicon oxide.

4. The method of claim 3, wherein said first dielectric layer is formed to have a thickness of approximately 4000–10000 angstroms.

5. The method of claim 1, wherein said first conductive layer comprises doped polysilicon.

6. The method of claim 5, wherein said first conductive layer has a thickness in a range of about 500–2000 angstroms.

7. The method of claim 5, wherein said doped polysilicon comprises in-situ doped polysilicon.

8. The method of claim 1, wherein said second dielectric layer is composed of silicon oxide.

9. The method of claim 8, wherein said second dielectric layer is formed to have a thickness of approximately 500–2000 angstroms.

10. The method of claim 8, wherein said second dielectric layer is etched by using a reactive ion etching process (RIE).

11. The method of claim 1, wherein said contact hole is formed by using a RIE process.

12. The method of claim 11, wherein said RIE process uses an etchant comprising $CHF_3+Ar+O_2$ plasma.

13. The method of claim 1, wherein removing said first dielectric layer and said second dielectric layer comprises etching said first and second dielectric layers using an etchant comprising HF.

14. The method of claim 1, wherein said second conductive layer has a thickness in a range of about 500 to 2000 angstroms.

15. The method of claim 14, wherein said second conductive layer comprises doped polysilicon.

16. The method of claim 15, wherein said doped polysilicon comprises in-situ doped polysilicon.

17. The method of claim 1, wherein said third conductive layer has a thickness in a range of about 2000 angstroms.

18. The method of claim 17, wherein said third conductive layer comprises doped polysilicon.

19. The method of claim 18 wherein said doped polysilicon comprises in-situ doped polysilicon.

20. The method of claim 1, wherein said dielectric film comprises tantalum oxide ($Ta_2O_5$).

21. The method of claim 1, wherein said dielectric film comprises a triple film of oxide/nitride/oxide films.

22. The method of claim 1, wherein said dielectric film comprises a double film of nitride/oxide films.

23. A method of forming a polysilicon structure on a semiconductor substrate, said method comprising:

forming a first oxide layer above said semiconductor substrate;

forming and patterning a first photoresist having an opening on said first oxide layer;

etching a portion of said first oxide to form a hole in said first oxide layer using said first photoresist as an etching mask, said hole having an opening of a first width;

expanding the opening of said first photoresist, the expanded opening of said first photoresist is approximately centered over said hole and the expanded opening of said first photoresist having a second width, said second width of the expanded opening of said first photoresist is greater than said first width of the opening of said hole;

etching the first oxide layer and said hole using said first photoresist with the expanded opening as an etching mask whereby said hole includes an upper portion and a lower portion, said lower portion forming a contact hole; stripping said first photoresist;

forming a first polysilicon layer on said first oxide layer and in said contact hole;

forming a second oxide layer along a surface of said first polysilicon layer;

anisotropically etching said second oxide layer to the surface of said first polysilicon layer, wherein residual portions of said second oxide layer are left on a sidewall of said first polysilicon layer, thereby forming a sidewall spacer;

forming and patterning a second photoresist on said first polysilicon layer wherein said second photoresist covers said hole;

etching said first polysilicon layer using said second photoresist as an etching mask;

stripping said second photoresist;

forming a second polysilicon layer on said first oxide layer, said first polysilicon layer and over a surface of said sidewall spacer;

anisotropically etching said second polysilicon layer wherein portions of said second polysilicon layer are left on a sidewall of said residual portions of said second oxide layer and said first polysilicon layer; and removing said first oxide layer and said second oxide layer.

24. A method for manufacturing a dynamic random access memory cell, said method comprising:

forming a first layer over a substrate, said substrate having formed therein and thereon a transistor, a word line and a bit line;

forming a first dielectric layer over said first layer, said first dielectric layer having a top surface;

forming a trench in said first dielectric layer, said trench having an upper portion and a lower portion, said upper portion having a width greater than a width of said lower portion, said lower portion exposing a source/drain region of said transistor;

forming a first conductive layer on said first dielectric layer, said first conductive layer substantially filling said lower portion of said trench and conformally covering said upper portion of said trench and said top surface of said first dielectric layer;

forming a second dielectric layer conformally covering said first conductive layer;

anisotropically etching said second dielectric layer to expose a top surface of said first conductive layer, wherein remaining portions of said second dielectric layer line a sidewall of said upper portion of said trench;

forming an etching mask covering said trench, said etching mask having a width greater than said width of said upper portion of said trench;

etching said first conductive layer to expose portions of said top surface of said first dielectric layer surrounding said etching mask;

removing said etching mask;

forming a second conductive layer conformally covering exposed portions of said first dielectric layer, said first conductive layer and said remaining portions of said second dielectric layer;

anisotropically etching said second conductive layer to expose said top surface of said first dielectric layer, wherein remaining portions of said second conductive layer form sidewall spacers within said upper portion of said trench and on a sidewall of said first conductive layer above said trench; and removing said first and second dielectric layers while leaving said first conductive layer and said remaining portions of said second conductive layer substantially intact.

25. The method of claim 24 wherein said first and second dielectric layers comprise silicon oxide.

26. The method of claim 24 wherein said first and second conductive layers comprise doped polysilicon.

27. The method of claim 24 wherein removing said first and second dielectric layers comprises etching said first and second dielectric layers using an etchant comprising HF.

28. The method of claim 24 wherein said first layer comprises a nitride layer.

* * * * *